(12) United States Patent
Verdant

(10) Patent No.: US 11,545,992 B2
(45) Date of Patent: Jan. 3, 2023

(54) DYNAMIC COMPARATOR

(71) Applicant: Commissariat à l'Energie Atomique et aux Energies Alternatives, Paris (FR)

(72) Inventor: Arnaud Verdant, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 17/450,598

(22) Filed: Oct. 12, 2021

(65) Prior Publication Data
US 2022/0182068 A1    Jun. 9, 2022

(30) Foreign Application Priority Data

Dec. 9, 2020    (FR) ........................ 2012890

(51) Int. Cl.
*H03M 1/42*    (2006.01)
*H03M 1/80*    (2006.01)
*G06F 7/02*    (2006.01)

(52) U.S. Cl.
CPC ............. *H03M 1/42* (2013.01); *H03M 1/804* (2013.01); *G06F 7/02* (2013.01)

(58) Field of Classification Search
CPC ................................ H03M 1/42; H03M 1/804
See application file for complete search history.

(56) References Cited

U.S. PATENT DOCUMENTS

| 6,801,146 | B2 * | 10/2004 | Kernahan | ............. | H03L 7/0996 341/122 |
| 7,847,588 | B2 * | 12/2010 | Bertin | ................. | G11C 29/021 326/39 |
| 9,917,594 | B1 * | 3/2018 | Soundararajan | ..... | H03K 5/2481 |
| 2004/0095112 | A1 * | 5/2004 | Kernahan | ........... | H02M 1/0845 323/282 |
| 2004/0095264 | A1 * | 5/2004 | Thomas | .............. | H02M 3/1582 341/53 |
| 2004/0095266 | A1 * | 5/2004 | Kernahan | ............... | G05F 3/262 341/165 |

(Continued)

OTHER PUBLICATIONS

Preliminary Search Report for French Application No. 2012890 dated Aug. 24, 2021, 2 pages.

(Continued)

*Primary Examiner* — Lam T Mai
(74) *Attorney, Agent, or Firm* — Moreno IP Law LLC

(57) ABSTRACT

The present description relates to a comparator (2) comprising a ring of gates (110A, 110B, 110A', 110B', 106, 108) in series, wherein: each gate implements an inverting function between a first input (100) and an output (102) of the gate; at least one (110A', 110B') gate is controllable and is associated with another gate; each controllable gate (110A', 110B') comprises a control input (116) coupled with the output (102) of said associated gate, and prevents switching of its output (102) to a high state if its control input (116) is in the high state, and to a low state otherwise; and the control input (116) of each controllable gate (110A', 110B') receives the output (102) of said associated gate if an even number of gates separates these two gates, and receives the complement of said output if not.

15 Claims, 2 Drawing Sheets

(56) References Cited

U.S. PATENT DOCUMENTS

| | | | |
|---|---|---|---|
| 2005/0258874 A1* | 11/2005 | Kudo | H03K 17/063 |
| | | | 327/91 |
| 2018/0069566 A1* | 3/2018 | Soundararajan | H03K 5/2481 |
| 2018/0131383 A1* | 5/2018 | Soundararajan | H03M 1/46 |
| 2019/0181873 A1* | 6/2019 | Ghosh | H03K 5/2481 |
| 2019/0386670 A1* | 12/2019 | Ghosh | H03M 1/089 |
| 2020/0321970 A1* | 10/2020 | Ghosh | H03M 1/089 |
| 2022/0286100 A1* | 9/2022 | Kobayashi | H03F 1/3211 |
| 2022/0311429 A1* | 9/2022 | Ji | H03K 5/1254 |

OTHER PUBLICATIONS

M. Shim et al., "Edge-Pursuit Comparator: An Energy-Scalable Oscillator Collapse-Based Comparator With Application in a 74.1 dB SNDR and 20kS/s 15 b SAR ADC," IEEE J. of Solid-State Circuits, vol. 52, No. 4, Apr. 2017, pp. 1077-1090.

R. Nayak et al., "Low power ring oscillator of IoT applications," Analog Integr. Cir. Sig. Process., vol. 93, No. 2, Jun. 30, 2017, pp. 257-263.

\* cited by examiner

DYNAMIC COMPARATOR

FIELD

The present disclosure relates generally to electronic circuits, and more specifically to the dynamic comparators that can be provided in such electronic circuits.

BACKGROUND

Dynamic comparators serve to perform the comparison of two signals, in a synchronized manner with a signal, typically a clock signal, and to produce a binary signal whose binary state indicates the result of this comparison.

Dynamic comparators are for example used in successive-approximation analog-digital converters. In such a converter, the dynamic comparator synchronously produces an output signal that is representative of the comparison of an analog signal to a threshold quantification voltage. This makes it possible to quantify the residue of the analog signal that is digitized by the converter, in each step of the search by dichotomy for the digital code associated with the analog signal.

As an example, a successive-approximation analog-digital converter comprises a charge distribution node to which are connected first electrodes of a plurality of capacitors with increasing values. The node is charged with the analog signal to be digitized while a given low voltage, typically a zero voltage, is applied on the second electrodes of the capacitors. Then, a high voltage is applied on the second electrode of the capacitor of higher value and the voltage on the charge distribution node is compared, by a dynamic comparator, with a quantification voltage. If the voltage of the charge distribution node is greater than the quantification voltage, the second electrode that was polarized by the high voltage is repolarized at the low voltage; otherwise, the high voltage is maintained. Then, these operations are repeated from the strongest capacitor to the weakest capacitor, until the digital code associated with the analog signal to be digitized is obtained, from high or low polarizations applied on each of the second electrodes of the capacitors.

Among dynamic comparators, dynamic latched comparators are known. A dynamic latched comparator, for example the dynamic latched comparator illustrated on the Wikipedia page relative to comparators, typically comprises two feedback inverters, the outputs of which are initialized at a high level during a preliminary phase, and a differential pair connecting the inverters to the ground, the two input transistors of the differential pair receiving the two signals to be compared. Thus, the highest-value signal received by the input transistors of the differential pair induces a greater current in the corresponding inverter, which causes faster switching of the output of this inverter to the low level, and maintenance of the output of the other inverter at the high level.

However, in a dynamic latched comparator, the manufacturing dispersions between the transistors, in particular between the input transistors of the differential pair, lead to comparison errors, therefore to quantification errors when the comparator is implemented in a successive-approximation analog-digital converter. Furthermore, the gate-drain capacitor of each of the input transistors of the differential pair causes a charge inrush on the input of the comparator, which depends on the switching of the inverter of the comparator associated with this transistor. This charge inrush, commonly called kick-back effect, is detrimental to the precision of the comparator, therefore to the quantification of an analog signal when the comparator is implemented in a successive-approximation analog-digital converter.

Among dynamic comparators, edge pursuit dynamic comparators are also known.

FIG. 1 shows an example of an edge pursuit dynamic comparator. More particularly, FIG. 1 corresponds to FIG. 2 of the article by M. Shim et al. titled "Edge-Pursuit Comparator: An Energy-Scalable Oscillator Collapse-Based Comparator With Application in a 74.1 dB SNDR and 20 kS/s 15 b SAR ADC" and published in IEEE Journal of Solid-State Circuits, Vol. 52, No. 4, April 2017.

The comparator of FIG. 1 rests on an elementary inverter structure made up of a standard CMOS (Complementary Metal Oxide Semiconductor) inverter polarized by a first N-channel MOS transistor connected between the source of the N-channel MOS transistor of the inverter and a reference potential, and of a second P-channel MOS transistor connected between the source of the P-channel MOS transistor of the inverter and a supply potential. The gates of these first and second transistors receive a same polarization voltage, chosen among two voltages VINP and VINM compared by the comparator. By cascading these elementary structures and alternating the polarization voltage VINP or VINM of the cascaded elementary structures, for example such that the upstream elementary structure is polarized by the voltage VINP and the downstream elementary structure is polarized by the voltage VINM, the following four cases are observed:

rising input edge ("E1" in FIG. 1) on the upstream elementary structure and VINP greater than VINM ("VINP>VINM" in FIG. 1): rapid fall ("F1-d" in FIG. 1) of the output of the upstream elementary structure and rapid rise ("F1-u" in FIG. 1) of the output of the downstream elementary structure, rising input edge on the upstream elementary structure and VINP less than VINM: slow fall of the output of the upstream elementary structure and slow rise of the output of the downstream elementary structure, falling input edge ("E2" in FIG. 1) on the upstream elementary structure and VINP greater than VINM ("VINP>VINM" in FIG. 1): slow rise ("S2-u" in FIG. 1) of the output of the upstream elementary structure and slow fall ("S2-d" in FIG. 1) of the output of the downstream elementary structure, and falling input edge on the upstream elementary structure and VINP less than VINM: rapid rise of the output of the upstream elementary structure and rapid fall of the output of the downstream elementary structure.

The comparator of FIG. 1 comprises two branches, each comprising four elementary structures. The two branches are looped on one another by two gates A and B of the NAND type, so as to form a ring structure. In one of the branches (the top branch in FIG. 1), the elementary structures are alternatively polarized by the voltages VINP, then VINM, whereas it is the reverse in the other branch (the bottom branch in FIG. 1). Furthermore, the input of each NAND gate that is not connected to the output of a branch receives a synchronization signal START.

The operation of this comparator is as follows. In the initial state, the signal START is in the low state, as a result of which the output of each gate A and B is in the high state and the output of each branch, including the output COMP of the comparator, are also in the high state. The passage to the high state of the signal START, that is to say, a rising edge on the signal START, causes the output of each gate A and B to go to the low state, that is to say, a falling edge is provided to the ring structure of the comparator by each of the gates A and B. These two edges will propagate at different speeds in the ring, which depend on the polarization voltages VINP and VINM. The two edges then propagate in the ring (arrows 11 in FIG. 1) of the comparator until the rapid edge rejoins, or catches up with, the slow edge, which results in a stabilization of the outputs of the elementary structures of the two branches, the outputs of the gates A and B, and the output COMP of the comparator. For example, in the configuration of FIG. 1, the output COMP stabilizes at the high level when the voltage VINP is greater than the voltage VINM, and at the low level when the voltage VINP is less than the voltage VINM.

In a comparator of the edge pursuit type, the sequence of transitions on the two branches tends to average the kick-back effect. This makes it possible to decrease the negative influence of this kick-back effect relative to the case of a dynamic latched comparator. Similarly, the comparison errors caused by manufacturing dispersions, as well as temporal noise, are reduced relative to a dynamic latched comparator. More precisely, the more the number of elementary structures per branch increases, the more these comparison errors and this temporal noise are smoothed.

However, one drawback of the comparator of FIG. 1 is that the stabilization time of its ring, and therefore of its output COMP, increases with the decrease in the gap between the voltages VINP and VINM that are compared. The increase in stabilization time is not desirable, in particular as it causes an increase in consumption.

SUMMARY

There is a need to address all or some of the drawbacks of the known dynamic comparators.

For example, there is a need to address all or some of the drawbacks of the known edge pursuit dynamic comparators.

One embodiment addresses all or some of the drawbacks of the known dynamic comparators.

For example, one embodiment addresses all or some of the drawbacks of the known edge pursuit dynamic comparators.

One embodiment provides a dynamic comparator of a first voltage with a second voltage, of the edge pursuit type, comprising a ring of logic gates in series, wherein:
each gate of the ring comprises a first input connected to an output of the preceding gate of the ring;
each gate of the ring is configured to implement an inverting function between its first input and its output;
at least one of said gates of the ring is controllable and is associated with another one of said gates of the ring;
each controllable gate comprises a control input coupled to the output of the gate associated with said controllable gate;
each controllable gate is configured to prevent switching of its output to a high state when its control input is in the high state, and to a low state when its control input is in the low state;
the control input of each controllable gate is configured to receive the state of the output of the gate associated with said controllable gate if an even number of gates of the ring separates the controllable gate from said associated gate, and to receive the complementary state of said output if not; and
the ring has an even number of logic gates.

According to one embodiment, each controllable gate is separated from the gate associated with the controllable gate by at least one of said gates of the ring.

According to one embodiment, a number of gates of the ring separating each controllable gate from the gate associated with said controllable gate is strictly less than half the total number of gates of the ring minus one.

According to one embodiment:
said gates of the ring comprise a first logic gate, a second logic gate, and third and fourth logic gates;
a first branch of the ring comprises alternating third and fourth gates in series between the output of the first gate and the first input of the second gate, the first branch beginning with a third gate;
a second branch of the ring comprises alternating third and fourth gates in series between the output of the second gate and the first input of the first gate, the second branch beginning with a fourth gate; and
each of the third and fourth gates is polarized from the first voltage and/or from the second voltage, the polarization of the third gates being complementary to that of the fourth gates, the polarization of each of the third and fourth gates determining a switching speed of the output of said gate to the high state and a switching speed of the output of said gate to the low state.

According to one embodiment, each branch includes a same number of third gates and each branch includes a same number of fourth gates.

According to one embodiment:
each of the third and fourth gates comprises a first polarization node and a second polarization node, for example combined with the first node, a voltage on the first node determining the switching speed of the output of said gate to the high state and a voltage on the second node determining the switching speed of the output of said gate to the low state;
the first nodes of the third gates are configured to receive the first voltage or the second voltage, the first nodes of the fourth gates being configured to receive the second voltage when the first nodes of the third gates receive the first voltage, or the first voltage when the first nodes of the third gates receive the second voltage; and
the second nodes of the third gates are configured to receive the first voltage or the second voltage, the second nodes of the fourth gates being configured to receive the second voltage when the second nodes of the third gates receive the first voltage, or the first voltage when the second nodes of the third gates receive the second voltage.

According to one embodiment, each controllable gate comprises a first MOS transistor connecting the output of the controllable gate to a node for applying a high potential, the first transistor having a gate connected to the control input of the controllable gate and being configured, in the off state, to electrically isolate the output of the controllable gate from the node for applying the high potential. The controllable gate further comprises a second MOS transistor connecting the output of the gate to a node for applying a low potential, the second transistor having a gate connected to the control input of the controllable gate and being configured, in the off state, to electrically isolate the output of the controllable gate from the node for applying the low potential.

According to one embodiment, each of the third and fourth gates comprises:
at least one first MOS transistor configured to switch the output of said gate to the high state when the first input of said gate receives a falling edge, said at least one first transistor being polarized from the voltage on the first node of said gate; and
at least one second MOS transistor configured to switch the output of said gate to the low state when the first input of said gate receives a rising edge, said at least one second transistor being polarized from the voltage on the second node of said gate.

According to one embodiment, each of the third and fourth gates comprises a single first transistor and a single second transistor.

According to one embodiment, in each of the third and fourth gates:
said at least one first transistor is in series with a transistor having a gate connected to the first node of said gate and said at least one second transistor is in series with another transistor having a gate connected to the second node of said gate; or
said at least one first transistor and said at least one second transistor are implemented on silicon on insulator, for example completely depleted, a back gate of each first transistor being connected to the first node of said gate and a back gate of each second transistor being connected to the second node of said gate.

According to one embodiment, each controllable gate is one of the third and fourth gates and further comprises a third MOS transistor configured, in the off state, to electrically isolate the output of said controllable gate from a node for applying a supply voltage, and a fourth MOS transistor configured, in the off state, to electrically isolate the output of said controllable gate from a node for applying a reference voltage, a gate of each of the third and fourth transistors being connected to the control input of said controllable gate.

According to one embodiment, the first and second branches are symmetrical.

According to one embodiment, each of the first and second gates further comprises a second input configured to receive a synchronization signal, the implementation of the inverting function between the first input and the output of said gate being conditioned by the state of the synchronization signal.

According to one embodiment, for each controllable gate, the gate associated with said controllable gate is the first gate or one of the third and fourth gates of the first branch when said controllable gate belongs to the first branch, and is the second gate or one of the third and fourth gates of the second branch when said controllable gate belongs to the second branch.

One embodiment provides an analog-digital converter comprising a comparator as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Figure 1:
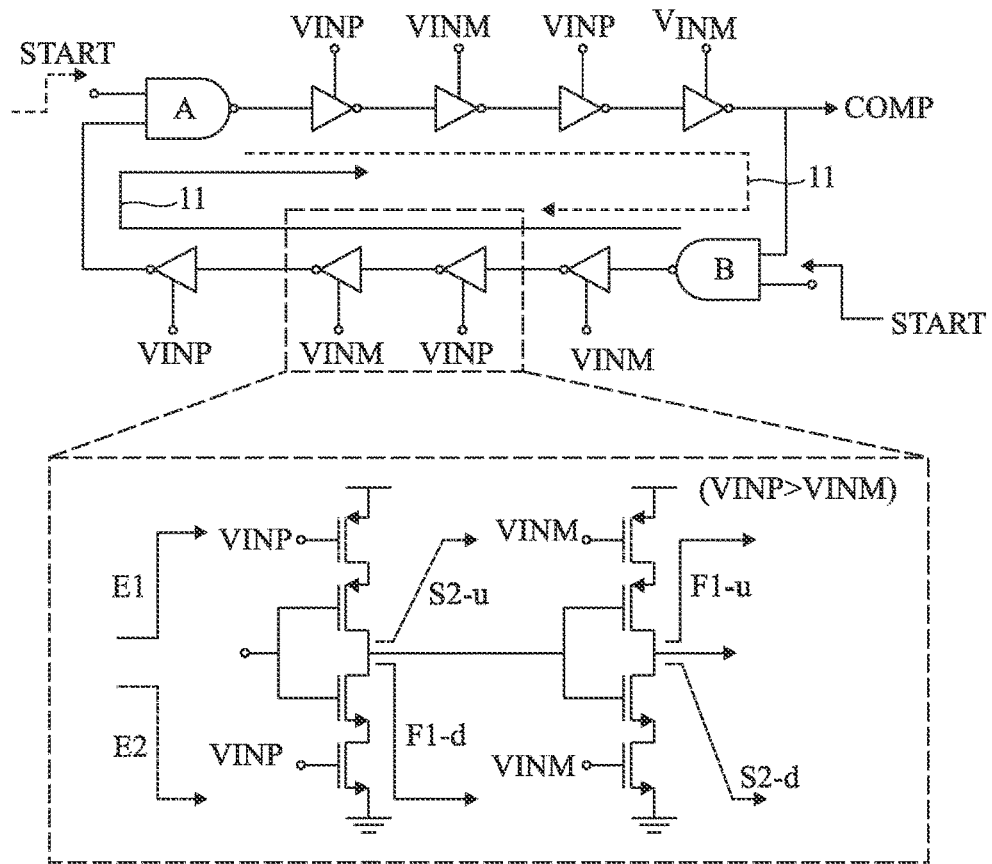
FIG. 1, previously described, shows an example of an edge pursuit dynamic comparator.

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the usual electronic circuits in which a dynamic comparator is implemented have not been described in detail, the described embodiments being compatible with these usual circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

In the remainder of the description, in a ring of an edge pursuit dynamic comparator, it is considered that a first logic gate of the ring precedes, or is upstream of, a second logic gate of the ring, when an edge propagating in the ring is first propagated by, or through, the first gate, then by, or through, the second gate. Conversely, it is further considered that a first logic gate of the ring follows, or is downstream of, a second logic gate of the ring, when an edge propagating in the ring is first propagated by, or through, the second gate, then by, or through, the first gate. In other words, the terms "upstream," "downstream," "preceding" and "following" applied to the gates of the ring are defined relative to the direction of propagation of the edges in the ring.

In the remainder of the description, an edge, or a binary transition, can have two different meanings, namely the rising direction and the falling direction. An edge in the rising direction, respectively falling direction, will more generally be called rising edge, respectively falling edge.

In the remainder of the description, a logic gate will be referred to as a purely combinatory gate, or circuit, that is to say, devoid of any storage function. Preferably, the logic gates described here are implemented using CMOS (Complementary Metal Oxide Semiconductor) technology.

The present application proposes an edge pursuit dynamic comparator, in which at least one of the logic gates of the branches of the ring of the comparator is controlled by an output of a gate upstream of, or preceding, the ring, and is configured to block the propagation of the slowest edge when the output of this upstream gate switches following the propagation of the fastest edge. Because the upstream gate and the gate controlled by the output of the upstream gate are separated from one another by at least one other logic gate of the ring, this makes it possible to reduce the stabilization time of the ring, and therefore to reduce the consumption of the comparator.

Figure 2:
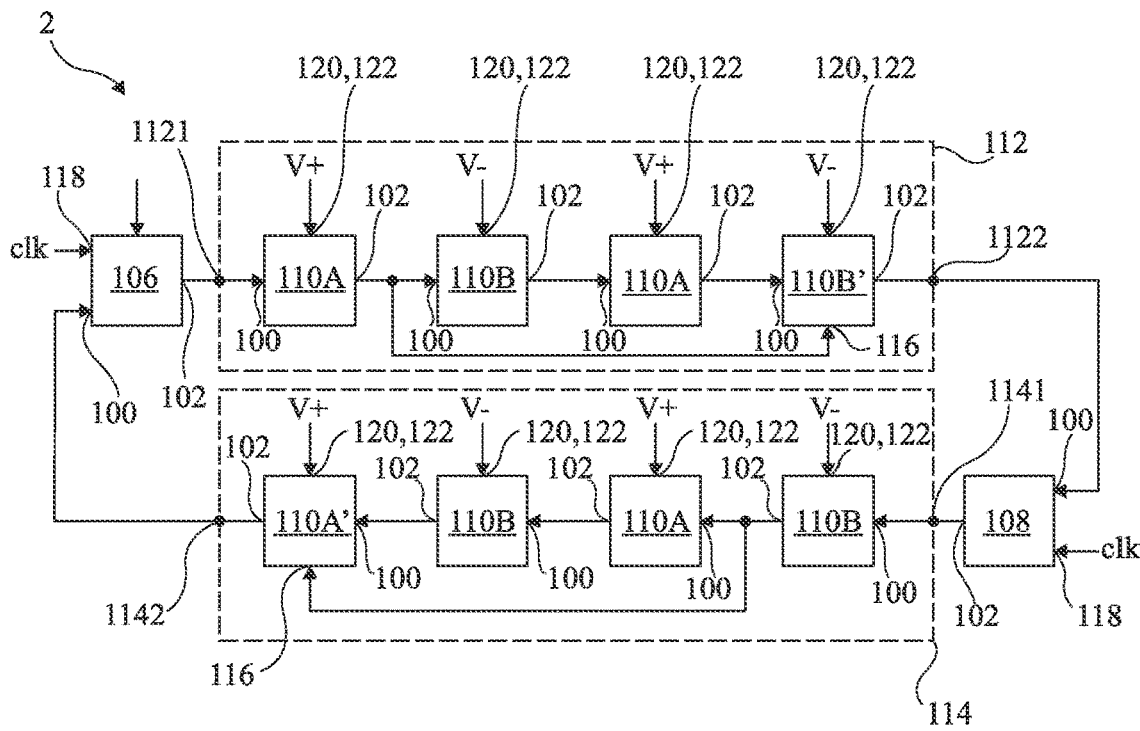
FIG. 2 shows, schematically and in block diagram form, an embodiment of an edge pursuit dynamic comparator.

FIG. 2 shows, schematically and in block diagram form, an embodiment of such a comparator 2. The comparator 2 is configured to compare a voltage V+ with a voltage V−.

The comparator 2 comprises a ring. The ring includes several logic gates in series. More particularly, each gate of the ring comprises an input 100 connected to an output 102 of the preceding gate of the ring. Each gate of the ring is configured to implement an inverting function between its input 100 and its output 102.

According to one embodiment, the gates of the ring comprise a logic gate 106, a logic gate 108, logic gates 110A and logic gates 110B. The ring comprises a branch 112 (defined by dotted lines in FIG. 2) and a branch 114 (defined by dotted lines in FIG. 2). The branches 112 and 114 are looped on one another by the gates 106 and 108.

According to this embodiment, the branch 112 comprises alternating gates 110A and 110B between its input 1121 and its output 1122. The branch 112 begins with a gate 110A or, in other words, the input 1121 of the branch 112 corresponds to the input 100 of a gate 110A. Furthermore, the branch 114 comprises alternating gates 110A and 110B between its input 1141 and its output 1142. The branch 114 begins with a gate 110B or, in other words, the input 1141 of the branch 114 corresponds to the input 100 of a gate 110B. Each gate 110A, 110B is polarized from the voltage V+ and/or the voltage V−. The polarization, from one and/or the other of the voltages V+ and V−, of each gate 110A, 110B determines a switching speed of the output 102 of the gate to the high state and a switching speed of the output 102 of the gate to the low state. More particularly, each gate 110A is polarized, from one and/or the other of the voltages V+ and V−, in a manner complementary to how each gate 110B is polarized from one and/or the other of these voltages V+ and V−. Thus, when the voltages V+ and V− are different, the switching speeds to the low, respectively high, state of the gates 110A are different from the switching speeds to the low, respectively high, state of the gates 110B.

According to one embodiment, each gate 110A, 110B comprises a polarization node 120 and a polarization node 122. The switching speed to the high state of the output 102 of each gate 110A, 110B is determined by a voltage on the node 120 of the considered gate, a switching speed to the low state of the output 102 of each gate 110A, 110B being determined by a voltage on the node 122 of the considered gate. The complementary polarization between the gates 110A and 110B is then implemented as follows. The nodes 120 of the gates 110A are configured to receive the voltage V+ or V−, and the nodes 120 of the gates 110B are configured to receive the voltage V+ when the nodes 120 of the gates 110A receive the voltage V−, or to receive the voltage V− when the nodes 120 of the gates 110A receive the voltage V+. Furthermore, the nodes 122 of the gates 110A are configured to receive the voltage V+ or V−, and the nodes 122 of the gates 110B are configured to receive the voltage V+ when the nodes 122 of the gates 110A receive the voltage V−, or to receive the voltage V− when the nodes 122 of the gates 110A receive the voltage V+.

In the embodiment of FIG. 2, the nodes 120 and 122 of each gate 110A receive the same voltage V+, the nodes 120, 122 of each gate 110B receiving the same voltage V−. In this case, as shown in FIG. 2, the nodes 120 and 122 can be combined. In a variant embodiment that is not illustrated, the node 120 of each gate 110A receives the voltage V+, the node 120 of each gate 110B receives the voltage V−, the node 122 of each gate 110A receives the voltage V− and the node 122 of each gate 110B receives the voltage V+. However, the embodiment where each gate receives the same voltage on its two nodes 120 and 122 is preferred because it allows the comparator 2 to stabilize more quickly for a given gap between the voltages V+ and V−.

According to one embodiment, the branch 112 comprises the same number of gates 110A as the branch 114, and the same number of gates 110B as the branch 114. Preferably, each branch 112, 114 of the ring comprises a same even number of gates 110A, 110B.

The ring comprises an even number of logic gates 110A, 110B, 106 and 108. Due to the inverting function implemented by each gate 110A, 110B, 106 and 108, between its input 100 and its output 102, when edges propagate in the ring, the ring stabilizes when the fastest edge catches up with the slowest edge.

An output OUT of the comparator 2 is available on the output 1122 of the branch 112 or on the output 1142 of the branch 114.

Among the gates 106, 108, 110A, 110B, preferably among the gates 110A and 110B of the ring, one or several gates are controllable. In the example of FIG. 2, the branch 112 of the ring comprises a controllable gate 110B, referenced 110B' in the remainder of the description, and the branch 114 of the ring comprises a controllable gate 110A, referenced 110A' in the remainder of the description. More particularly, in the example of FIG. 2, the gate 110B' of the branch 112 is the last gate of the branch, or in other words, the output of the gate 110B' of the branch 112 corresponds to the output 1122 of the branch 112, and the gate 110A' of the branch 114 is the last gate of the branch, or in other words, the output of the gate 110A' of the branch 114 corresponds to the output 1142 of the branch 114. However, the described embodiments are not limited to this example. For example, one of the branches 112, 114 or each of the branches 112 and 114 can comprise more than one controllable gate, or one of the two branches 112, 114 can be devoid of controllable gate. Furthermore, the number and/or the position of the controllable gates of the branch 112 can be different from the number and/or the position of the controllable gates of the branch 114. However, in preferred embodiments, when a controllable gate is arranged in a given position of the branch 112, and is separated from the associated gate that controls it by a given number of gates, the branch 114 comprises a controllable gate in the same position in the branch 114, this controllable gate of the branch 114 being separated from the associated gate that controls it by the same given number of gates. This makes it possible to obtain a comparator in which the stabilization, or response, time of the comparator is substantially the same when the voltage V+ is greater than the voltage V−, with a given gap between the voltages V+ and V−, and when the voltage V+ is less than the voltage V−, with the same given gap between these voltages V+ and V−.

In the remainder of the description, unless otherwise indicated, the expression "the gates 110A," respectively "the gates 110B," refers to all of the gates 110A, respectively 110B, of the ring, including any controllable gates 110A', respectively 110B'. Furthermore, although this is not illustrated here, each gate 106 and 108 can be a controllable gate as described above.

Each controllable gate of the ring is associated with another gate of the ring, preferably arranged upstream of the controllable gate in the ring. More particularly, each controllable gate 110A', 110B' comprises a control input 116 coupled to the output 102 of the gate with which this controllable gate is associated. In the example of FIG. 2, the input 116 of the controllable gate 110B' of the branch 112 is coupled to the output 102 of the first gate of the branch 112, namely here a gate 110A, the input 116 of the controllable gate 110A' of the branch 114 being coupled to the output 102 of the first gate of the branch 114, here namely a gate 110B. However, the described embodiments are not limited to this example, and a controllable gate of a branch can be associated with a gate that is not the first gate of this branch. Furthermore, a controllable gate 110A', 110B' can be associated with, or controlled by, a gate 106 or 108.

According to one embodiment, each controllable gate 110A', 110B' is separated from the gate associated with this controllable gate by one or several other gates of the ring.

According to one embodiment, the number of gates separating each controllable gate 110A', 110B' from the gate with which this controllable gate is associated is strictly less than half the total number of gates of the ring decreased by one unit. In the example of FIG. 2 where each branch 112, 114 comprises two gates 110A and two gates 110B, and where the total number of gates of the ring is equal to ten, at most three gates of the ring separate each controllable gate 110A', 110B' from the gate with which it is associated. The number of gates separating a controllable gate 110A', 110B' and the gate that controls it, that is to say, the number of gates arranged between the input 100 of this controllable gate 110A', 110B' and the output 102 of the gate that controls it, is counted following the direction of propagation of the edges in the ring, from the output 102 of the gate associated with the controllable gate. Thus, in the example of FIG. 2, the controllable gate 110B' of the branch 112 is separated from the gate 110A that controls it by two gates, namely successively a gate 110B and a gate 110A going from the output 102 of the gate 110A that controls the gate 110B' to the input of the controllable gate 110B'. Similarly in the example of FIG. 2, the controllable gate 110A' of the branch 114 is separated from the gate 110B that controls it by two gates, namely successively a gate 110A and a gate 110B going from the output 102 of the gate 110B that controls the gate 110A' to the input of the controllable gate 110A'.

According to one embodiment, the gate associated with each controllable gate of the branch 112, respectively 114, belongs to this branch 112, respectively 114, or corresponds to the gate 106, respectively 108.

According to one embodiment, the branches 112 and 114 are symmetrical. In other words, for each position in the branch 112, the gate that is in this position is identical to the gate that is in the same position in the opposite branch 114, with the exception, if applicable, of the voltage V+ and/or of the voltage V− received on the nodes 120 and 122 of these gates. In particular, when a controllable gate is arranged in a given position of the branch 112, and is separated from the associated gate that controls it by a given number of gates, the branch 114 preferably comprises a controllable gate in the same position in the branch 114, this controllable gate of the branch 114 preferably being separated from the associated gate that controls it by the same given number of gates.

According to one embodiment, all of the non-controllable gates 110A, 110B are identical, with the exception, if applicable, of the voltage V+ and/or of the voltage V− received on the nodes 120 and 122 of these gates, and all of the controllable gates 110A', 110B' are identical, with the exception, if applicable, of the voltage V+ and/or of the voltage V− received on the nodes 120 and 122 of these gates.

Each controllable gate 110A', 110B' is configured to prevent switching of its output 102 to the high state when its input 116 is in the high state, and to prevent its output 102 from switching to the low state when its input 116 is in the low state.

According to one embodiment, each controllable gate 110A', 110B' comprises a first MOS transistor connecting the output 102 of the controllable gate to a node for applying a high potential, for example a high supply potential, the gate of this first transistor being connected to the control input 116 of the controllable gate and being configured, in the off state, to electrically isolate the output 102 of the controllable gate from the node for applying the high potential. Symmetrically, each controllable gate 110A', 110B' further comprises a second MOS transistor connecting the output 102 of the gate to a node for applying a low potential, for example a low supply potential, the gate of this second transistor being connected to the control input 116 of the controllable gate and being configured, in the off state, to electrically isolate the output 102 of the controllable gate from the node for applying the low potential. In other words, the first MOS transistor is configured, in the off state, to prevent the output 102 of the controllable gate from switching to the high state, this first MOS transistor being configured to be off when the control input 116 of the controllable gate is in the high state, and symmetrically, the second MOS transistor is configured, in the off state, to prevent the output 102 of the controllable gate from switching to the low state, this second MOS transistor being configured to be off when the control input 116 of the controllable gate is in the low state. One advantage of such an embodiment is that, independent of the control input 116 and the state of the input 100 of a controllable gate, there is no cross conduction in the controllable gate. Of course, this embodiment applies when the gate 106 or 108 is controllable, the latter then comprising the first and second transistors described above, which makes it possible for there to be no cross conduction in the controllable gate regardless of the state of the control input 116, the input 100 and the input 118 of this controllable gate.

The input 116 of each controllable gate 110A', 110B' is configured to receive the high or low state of the output 102 of the gate with which this controllable gate is associated when the number of gates of the ring separating the controllable gate and the gate associated with it is even. In other words, in this case, the input 116 of the controllable gate is connected to the output 102 of the gate that is associated with it. Furthermore, the input 116 of each controllable gate 110A', 110B' is configured to receive the complementary state of the output 102 of the gate with which this controllable gate is associated, namely the high state if the output 102 is in the low state and the low state if the output 102 is in the high state, when the number of gates of the ring separating the controllable gate and the gate that is associated with it is odd. In other words, in this case, the input 116 of the controllable gate is coupled to the output 102 of the gate that is associated with it by an odd number of reversers, preferably by a single reverser. Like before, the number of gates separating a controllable gate and the gate that controls it, that is to say, the number of gates arranged between the input 100 of this controllable gate 110A', 110B' and the output 102 of the gate with which the controllable gate is associated, is counted following the direction of propagation of the edges in the ring, from the output 102 of the gate associated with the controllable gate.

In the comparator 2, each gate 106, 108 comprises an input 118 configured to receive a synchronization signal, for example a clock signal clk. Each gate 106, 108 is configured so that the reverser function implemented between its input 100 and its output 102 is conditioned by the state of the synchronization signal clk. For example, this reverser function is only implemented if the signal on the input 118 of the gate is a given state among the high and low states that this signal can assume.

For example, the gates 106 and 108 are each implemented by a NAND gate. In this case, the reverser function between the input 100 and the output 102 of the gate is only implemented if the signal clk is in the high state. Indeed, if the signal clk is in the low state, the output 102 of the gate is necessarily in the high state, independent of the state of the input 100 of the gate.

According to another example, the gates 106 and 108 are each implemented by a NOR gate. In this case, the reverser function between the input 100 and the output 102 of the gate is only implemented if the signal clk is in the low state. Indeed, if the signal clk is in the high state, the output 102 of the gate is necessarily in the low state, independent of the state of the input 100 of the gate.

The operation of the comparator 2 is as follows. In this example, it is considered that the gates 106 and 108 are each implemented by a NAND gate. At an initial instant, the signal clk is in the low state, as a result of which the output 102 of each gate 106 and 108 is in the high state and no edge, or transition, propagates in the ring. The output of each branch 112, 114 is then in the high state in the example illustrated by FIG. 2. At an following instant, the signal clk switches to the high state, which results in a falling edge of the output 102 of each gate 106, 108. These two edges then propagate in the ring, at speeds that depend on the difference between the voltage V+ and the voltage V−. At a following instant, the edge that propagates most slowly in the ring is located between a controllable gate and the associated gate that controls it, for example between the first gate 110A of the branch 112 and the gate 110B' of the branch 112. Furthermore, at this instant, the gate 110A that controls the controllable gate 110B' of the branch 112 receives the fastest edge, and its output switches, for example to the low state. In the example of FIG. 2 where an even number of gates separate the gate 110B' from the gate 100A that controls it, this blocks the switching to the low state of the output 102 of the controllable gate 110B'. At a following instant, the slowest edge arrives on the input 100 of the controllable gate 110B' of the branch 112, this slow edge being a rising edge in the considered example. Since the input 116 of the controllable gate 110B' of the branch 112 is in the low state, the output 102 of this gate 110B' cannot switch to the low state, and its state, namely the high state in the considered example, does not change. The slow edge is then blocked on the input 100 of this controllable gate 110B'. At a following instant, the fastest edge arrives on the input 100 of the controllable gate 110B' of the branch 112, this fast edge being a falling edge in the considered example, and therefore catches up with the slow edge. Because the output 102 of the gate 110B' is already in the high state, this does not modify the state of this output 102. As a result, the propagation of the edges in the ring is stopped, the ring stabilizes and the result of the comparison of the voltage V+ with the voltage V− is given by the state of the signal OUT.

Figure 3:
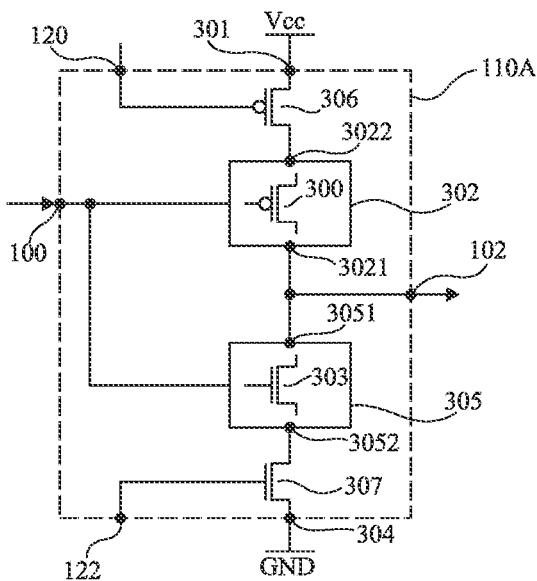
FIG. 3 schematically shows one embodiment of a gate of the dynamic comparator of FIG. 2.

FIG. 3 schematically shows one embodiment of a non-controllable gate 110A of the dynamic comparator 2 of FIG. 2. In this embodiment, all of the non-controllable gates 110A and 110B are for example implemented in the same way as the gate 110A of FIG. 3, by adapting the voltage(s) received by the nodes 120 and 122 of the gates 110B relative to those received by the nodes 120 and 122 of the gates 110A.

The gate 110A comprises at least one MOS transistor 300, preferably a P-channel MOS transistor, connecting the output 102 of the gate to a node 301 for applying a supply potential Vcc. In FIG. 3, the transistor 300, or the set of transistors 300 when the gate comprises several transistors 300, is shown schematically in the form of a block 302. As an example, when the gate comprises several MOS transistors 300, these transistors are associated in series and/or in parallel between a node 3021 that is coupled, for example connected, to the output 102, and a node 3022 that is coupled to the node 301.

The gate 110A further comprises at least one MOS transistor 303, preferably an N-channel MOS transistor, connecting the output 102 of the gate to a node 304 for applying a reference potential, for example the ground GND. In FIG. 3, the transistor 303, or the set of transistors 303 when the gate 108 comprises several transistors 303, is shown schematically in the form of a block 305. As an example, when the gate 108 comprises several MOS transistors 303, these transistors are associated in series and/or in parallel between a node 3051 that is coupled, for example connected, to the output 102, and a node 3052 that is coupled to the node 304.

The transistor(s) 300 are configured to switch the output 102 of the gate 110A to the high state (Vcc) when the input 100 of the gate 110A receives a falling edge, that is to say, a transition from the high state (Vcc) to the low state (GND). Similarly, the transistor(s) 303 are configured to switch the output 102 of the gate 110A to the low state (Vcc) when the input 100 of the gate 110A receives a rising edge, that is to say, a transition from the low state (GND) to the high state (Vcc). For example, the gate of each transistor 300, 303 is connected to the input 100 of the gate.

The transistor(s) 300 are polarized from the voltage present on the node 120 of the gate, as a result of which the switching speed to the high state of the output 102 of the gate depends on this voltage. Furthermore, the transistor(s) 303 are polarized from the voltage present on the node 122 of the gate, as a result of which the switching speed to the low state of the output 102 of the gate depends on this voltage.

In the embodiment illustrated by FIG. 3, the gate 110A further comprises a MOS transistor 306, preferably a P-channel MOS transistor, and a MOS transistor 307, preferably an N-channel MOS transistor. The transistor 306, respectively 307, is configured to implement the polarization of the transistor(s) 300, respectively 303, from the voltage on the node 120, respectively 122. The gate of the transistor 306 is connected to the node 120, the gate of the transistor 307 being connected to the node 122.

More particularly, the transistor 306 is in series with the transistor 300, or the set of transistors 300 if applicable, between the output 102 and the node 301 of the gate, the transistor 307 being in series with the transistor 303, or the set of transistors 303 if applicable, between the output 102 and the node 304.

In the example of FIG. 3, the transistor 306 couples the block 302 to the node 301, and the transistor 307 couples the block 305 to the node 304. For example, the transistor 306 has a conduction terminal, for example its source, coupled, preferably connected, to the node 301, and another conduction terminal, for example its drain, coupled, preferably connected, to the node 3022. Similarly, the transistor 307 for example has a conduction terminal, for example its source, coupled, preferably connected, to the node 304, and another conduction terminal, for example its drain, coupled, preferably connected, to the node 3052. In another example that is not illustrated, the transistor 306 couples the output 102 of the gate to the block 302 and/or the transistor couples the output 102 to the block 305.

According to one embodiment, the gate 110A comprises a single transistor 300 and a single transistor 303. In this case, a conduction terminal, for example the source, of the transistor 300 is coupled, preferably connected, to the node 3022, another conduction terminal, for example the drain, of the transistor 300 is coupled, preferably connected, to the node 3021, a conduction terminal, for example the source, of the transistor 303 is coupled, preferably connected, to the node 3052, and another conduction terminal, for example the drain, of the transistor 303 is coupled, preferably connected, to the node 3051.

In one variant embodiment, the gate 110A comprises several transistors 300, for example two transistors 300, connected in parallel between the nodes 3022 and 3021 and/or several transistors 303, for example two transistors 303, connected in series between the nodes 3051 and 3052.

As an example, the transistors of the gate 110A are implemented on a massive semiconductor substrate. According to another example, the transistors of the gate 110A are implemented on a structure of the semiconductor on insulator (SOI) type or of the fully-depleted SOI (FDSOI) type.

Figure 4:
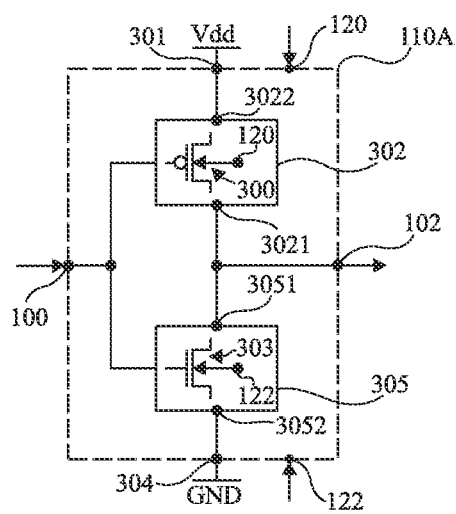
FIG. 4 schematically shows one variant embodiment of a gate of the dynamic comparator of FIG. 2.

FIG. 4 schematically shows one variant embodiment of the non-controllable gate 110A of the dynamic comparator of FIG. 3. In this variant, all of the non-controllable gates 110A and 110B are for example implemented in the same way as the gate 110A of FIG. 4, by adapting the voltage(s) received by the nodes 120 and 122 of the gates 110B relative to those received by the nodes 120 and 122 of the gates 110A.

The gate 110A of FIG. 4 comprises many elements in common with the gate 110A of FIG. 3, and only the differences between these two gates will be highlighted here.

More particularly, the gate 110A of FIG. 4 differs from that of FIG. 3 only by the manner in which the transistor(s) 300 are polarized from the voltage present on the node 120 of the gate, and in which the transistor(s) 303 are polarized from the voltage present on the node 122 of the gate.

In this variant, the transistors 300 and 303 are implemented from an SOI structure, preferably from an FDSOI structure.

Because the transistors 300 and 303 are implemented on SOI or on FDSOI, each of these transistors 300 and 303 has a back gate in addition to its gate, also called front gate. The back gate of each transistor 300, respectively 303, is then connected to the polarization node 120, respectively 122.

Because the voltage present on the back gate of the transistors 300 and the voltage present on the back gate of the transistors 303 modify the conduction threshold of these transistors, the switching speed to the high state of the output 102 of the gate 110A indeed depends on the voltage on the node 120 and the switching speed to the low state of the output 102 of the gate 110A indeed depends on the voltage on the node 122.

Thus, in this variant embodiment, the transistors 306 and 307 described in relation with FIG. 3 can be omitted, the gate 110A of FIG. 4 then being more compact than the gate 110A described in relation with FIG. 3. It will, however, be possible to provide for combining the variant embodiment of FIG. 4 and the embodiment of FIG. 3, that is to say, to provide that the gate 110A comprises the transistors 306 and 307 described in relation with FIG. 3 and that the back gates of the transistors 300 and 303 of this gate 110A are connected to the nodes 120 and 122, as described in relation with FIG. 4.

When the transistors 306 and 307 are omitted, as is for example the case in FIG. 4, the node 3022 is for example connected to the node 301, the node 3052 for example being connected to the node 304.

Figure 5:
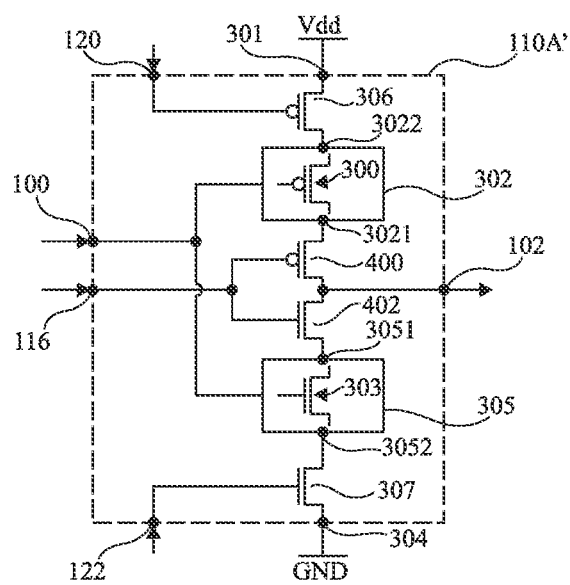
FIG. 5 schematically shows one embodiment of another gate of the dynamic comparator of FIG. 2.

FIG. 5 schematically shows one embodiment of a controllable gate 110A of the dynamic comparator 2 of FIG. 2. In this embodiment, all of the controllable gates 110A', 110B' are implemented in the same way as the gate 110A' of FIG. 5.

The gate 110A' of FIG. 5 comprises many elements in common with the gate 110A of FIG. 3, and only the differences between these two gates will be highlighted here.

More particularly, the gate 110A' of FIG. 5 differs from the gate 110A of FIG. 3 in that it further comprises the input 116, a MOS transistor 400, preferably a P-channel MOS transistor, and a MOS transistor 402, preferably an N-channel MOS transistor. The transistor 400, respectively 402, corresponds to the first transistor, respectively to the second transistor, mentioned in relation with FIG. 2, with the understanding that the terms "first" and "second" are used here only to distinguish these two transistors that could, for example, also have been called third transistor and forth transistor, respectively.

The (front) gate of the transistor 400 is connected to the control input 116 of the gate. The transistor 400 is configured, in the off state, to electrically isolate the output 102 of the gate 110A' from the node 301. For example, the transistor 300, or the set of transistors 300 if applicable, the transistor 306 and the transistor 400 are in series between the output 102 and the node 301. In the example illustrated by FIG. 5, the transistor 400 couples the node 3021 to the output 102, the transistor 400 then having a conduction terminal, for example its source, coupled, preferably connected, to the node 3021, and another conduction terminal, for example its drain, coupled, preferably connected, to the output 102. In other examples that are not illustrated, the transistor 400 is still in series with the block 302, but is arranged between the block 302 and the transistor 306, or between the transistor 306 and the node 301.

The (front) gate of the transistor 402, like the transistor 400, is connected to the input 116 of the gate 110A'. In a manner complementary to the transistor 400, the transistor 402 is configured, in the off state, to electrically isolate the output 102 of the gate 110A' from the node 304. For example, the transistor 303, or the set of transistors 303 if applicable, the transistor 307 and the transistor 402 are in series between the output 102 and the node 304. In the example illustrated by FIG. 5, the transistor 402 couples the node 3051 to the output 102, the transistor 402 then having a conduction terminal, for example its source, coupled, preferably connected, to the node 3051, and another conduction terminal, for example its drain, coupled, preferably connected, to the output 102. In other examples that are not illustrated, the transistor 402 is still in series with the block 305, but is arranged between the block 305 and the transistor 307, or between the transistor 307 and the node 304.

Thus, when a slow falling, respectively rising, edge reaches the input 100 of the controllable gate 110A', and a fast edge received by the input 100 of the gate of the ring that controls the gate 110A' has already caused the input 116 of the gate 110A' to switch to the high, respectively low, state, the transistor 400, respectively 402, is in the off state. As a result, the output 102 of the gate 110A' is isolated from the node 301, respectively 304, and remains kept in the low, respectively high state. The slow edge is therefore blocked on the input 100 of the gate 110A' until the fast rising, respectively falling edge catches the slow edge on the input 100 of the gate.

Above, in relation with FIG. 5, an embodiment was described of a controllable gate 110A' in which the transistor(s) 300, respectively 303, are polarized from the voltage on the node 120, respectively 122, by means of the transistor 306, respectively 307. In a variant embodiment that is not illustrated, similar to the variant embodiment described in relation with FIG. 4, each transistor 300, respectively 303, is implemented on SOI or FDSOI and comprises a back gate connected to the node 120, respectively 122. In such a variant, the transistors 306 and 307 can be omitted. It will, however, be possible to provide for combining this variant embodiment and the embodiment of FIG. 5, that is to say, to provide that the gate 110A' comprises the transistors 306 and 307 described in relation with FIG. 5 and that the back gates of the transistors 300 and 303 of this gate 110A' are connected to the nodes 120 and 122, as described in relation with FIG. 4.

As an example, in the case where:
the comparator 2 is identical to that shown in FIG. 2,
the gates 110A, 110B, 110A', 1103 are implemented in the manner described in relation with FIGS. 3 and 5,
each gate 110A, 110B, 110A', 1103 comprises only one single transistor 300 and one single transistor 302, and
the gates 104 and 106 are NAND gates,
the inventors have observed a consumption gain of about 30% relative to the comparator shown in FIG. 1. Furthermore, when the comparator 2 according to this example is implemented in a successive-approximation analog-digital converter, for example to replace the comparator shown in FIG. 1, this has little to no impact on the conversion error.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

What is claimed is:

1. A dynamic comparator of a first voltage with a second voltage, of the edge pursuit type, comprising a ring of logic gates in series, wherein:
    each gate of the ring comprises a first input connected to an output of the preceding gate of the ring;
    each gate of the ring is configured to implement an inverting function between its first input and its output;
    at least one of said gates of the ring is controllable and is associated with another one of said gates of the ring;
    each controllable gate comprises a control input coupled to the output of the gate associated with said controllable gate;
    each controllable gate is configured to prevent switching of its output to a high state when its control input is in the high state, and to a low state when its control input is in the low state;
    the control input of each controllable gate is configured to receive the state of the output of the gate associated with said controllable gate if an even number of gates of the ring separates the controllable gate from said associated gate, and to receive the complementary state of said output if not; and
    the ring has an even number of logic gates.

2. The comparator according to claim 1, wherein each controllable gate is separated from the gate associated with the controllable gate by at least one of said gates of the ring.

3. The comparator according to claim 1, wherein a number of gates of the ring separating each controllable gate from the gate associated with said controllable gate is strictly less than half the total number of gates of the ring minus one.

4. The comparator according to claim 1, wherein:
    said gates of the ring comprise a first logic gate, a second logic gate, and third and fourth logic gates;
    a first branch of the ring comprises alternating third and fourth gates in series between the output of the first gate and the first input of the second gate, the first branch beginning with a third gate;
    a second branch of the ring comprises alternating third and fourth gates in series between the output of the second gate and the first input of the first gate, the second branch beginning with a fourth gate; and
    each of the third and fourth gates is polarized from the first voltage and/or from the second voltage, the polarization of the third gates being complementary to that of the fourth gates, the polarization of each of the third and fourth gates determining a switching speed of the output of said gate to the high state and a switching speed of the output of said gate to the low state.

5. The comparator according to claim 4, wherein each branch includes a same number of third gates and each branch includes a same number of fourth gates.

6. The comparator according to claim 4, wherein:
    each of the third and fourth gates comprises a first polarization node and a second polarization node, for example combined with the first node, a voltage on the first node determining the switching speed of the output of said gate to the high state and a voltage on the second node determining the switching speed of the output of said gate to the low state;
    the first nodes of the third gates are configured to receive the first voltage or the second voltage, the first nodes of the fourth gates being configured to receive the second voltage when the first nodes of the third gates receive the first voltage, or the first voltage when the first nodes of the third gates receive the second voltage; and
    the second nodes of the third gates are configured to receive the first voltage or the second, the second nodes of the fourth gates being configured to receive the second voltage when the second nodes of the third gates receive the first voltage, or the first voltage when the second nodes of the third gates receive the second voltage.

7. The comparator according to claim 1, wherein each controllable gate comprises:
    a first MOS transistor connecting the output of the controllable gate to a node for applying a high potential, the first transistor having a gate connected to the control input of the controllable gate and being configured, in the off state, to electrically isolate the output of the controllable gate from the node for applying the high potential; and
    a second MOS transistor connecting the output of the gate to a node for applying a low potential, the second transistor having a gate connected to the control input of the controllable gate and being configured, in the off state, to electrically isolate the output of the controllable gate from the node for applying the low potential.

8. The comparator according to claim 6, wherein each of the third and fourth gates comprises:
    at least one first MOS transistor configured to switch the output of said gate to the high state when the first input of said gate receives a falling edge, said at least one first transistor being polarized from the voltage on the first node of said gate; and
    at least one second MOS transistor configured to switch the output of said gate to the low state when the first input of said gate receives a rising edge, said at least one second transistor being polarized from the voltage on the second node of said gate.

9. The comparator according to claim 8, wherein each of the third and fourth gates comprises a single first transistor and a single second transistor.

10. The comparator according to claim 8, wherein, in each of the third and fourth gates:
   said at least one first transistor is in series with a transistor having a gate connected to the first node of said gate and said at least one second transistor is in series with another transistor having a gate connected to the second node of said gate; or
   said at least one first transistor and said at least one second transistor are implemented on silicon on insulator, for example completely depleted, a back gate of each first transistor being connected to the first node of said gate and a back gate of each second transistor being connected to the second node of said gate.

11. The comparator according to claim 8, wherein each controllable gate is one of the third and fourth gates and further comprises a third MOS transistor configured, in the off state, to electrically isolate the output of said controllable gate from a node for applying a supply voltage, and a fourth MOS transistor configured, in the off state, to electrically isolate the output of said controllable gate from a node for applying a reference voltage, a gate of each of the third and fourth transistors being connected to the control input of said controllable gate.

12. The comparator according to claim 5, wherein the first and second branches and symmetrical.

13. The comparator according to claim 5, wherein each of the first and second gates further comprises a second input configured to receive a synchronization signal, the implementation of the inverting function between the first input and the output of said gate being conditioned by the state of the synchronization signal.

14. The comparator according to claim 5, wherein, for each controllable gate, the gate associated with said controllable gate is the first gate or one of the third and fourth gates of the first branch when said controllable gate belongs to the first branch, and is the second gate or one of the third and fourth gates of the second branch when said controllable gate belongs to the second branch.

15. An analog-digital converter comprising a comparator according to claim 1.

* * * * *